(12) United States Patent
Lambrecht et al.

(10) Patent No.: US 11,950,358 B1
(45) Date of Patent: Apr. 2, 2024

(54) INTEGRATED CIRCUIT PACKAGE WITH VOLTAGE DROOP MITIGATION

(71) Applicant: XILINX, INC., San Jose, CA (US)

(72) Inventors: Frank Peter Lambrecht, San Jose, CA (US); Brian D. Philofsky, Longmont, CO (US); Hong Shi, Los Gatos, CA (US); Prasun Raha, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 398 days.

(21) Appl. No.: 17/357,089

(22) Filed: Jun. 24, 2021

(51) Int. Cl.
*H05K 1/02* (2006.01)
(52) U.S. Cl.
CPC .................. *H05K 1/0262* (2013.01)
(58) Field of Classification Search
CPC .................................................... H05K 1/0262

USPC .......................................................... 327/534
See application file for complete search history.

(56) References Cited

U.S. PATENT DOCUMENTS 10,020,931 B2 * 7/2018 Abdelmoneum ..... H03L 7/0995

* cited by examiner

*Primary Examiner* — Tomi Skibinski
(74) *Attorney, Agent, or Firm* — Patterson + Sheridan, LLP

(57) ABSTRACT

A semiconductor device system comprises an integrated circuit (IC) die. The IC die is configured to operate in a first operating mode during a first period, and a second operating mode during a second period. The first period is associated with enabling an element of the IC die and a first amount of voltage droop. The second period occurs after the first period and is associated with a second amount of voltage droop. The second amount of voltage droop is less than the first amount of voltage droop.

20 Claims, 11 Drawing Sheets

INTEGRATED CIRCUIT PACKAGE WITH VOLTAGE DROOP MITIGATION

TECHNICAL FIELD

Examples of the present disclosure generally relate to electronic circuits and, in particular, to an integrated circuit package having mitigation circuitry for mitigating voltage droop.

BACKGROUND

One or more integrated circuit (IC) dies are mounted to a substrate, forming a package device or an IC package. As the power requirements of the IC dies and/or the number of IC dies that are mounted to a substrate increase, the complexity of the package device increases. The increasing complexity of the packages, increases the power requirements of the package device. However, the increasing power requirements may result in transient load conditions that generate a net voltage droop beyond a voltage droop threshold for the package device, leading to errors and/or faults within the package device.

In many instances, the net voltage droop effect at the start-up or exit clock gating of the one or more IC dies leaves little to no margin for other devices. For example, the net voltage droop effect of one or more IC dies may be 37 mV of a 40 mV threshold. Accordingly, any additional voltage droop introduced by other IC dies, interconnection interfaces, communication bus interfaces, and/or logic blocks of a corresponding package device may exceed 40 mV threshold, introducing errors and/or faults within the package device. In some instances, the voltage droop threshold (e.g., a maximum net voltage droop before errors and/or faults occur) may be increased through design changes to a package device. For example, additional layers may be added to one or more of the IC dies of the package device. However, such a process increases the manufacturing cost of the package device.

SUMMARY

A package device includes one or more IC dies mounted to a substrate. As the IC dies are enabled (e.g., a start-up and/or exit a clock gating process), voltage droop within a power supply occurs based on the increased power draw due to the changes in the transient load conditions. The corresponding net voltage droop may exceed the voltage droop threshold for the corresponding package device. Accordingly, errors and faults may occur within the operation of elements of the package device. However, by altering a start-up procedure and/or operating frequency of a clock signal, the transient load conditions and the associated net voltage droop may be decreased. During the design process of one or more of a package device, the voltage droop associated with the IC dies and circuit blocks within the IC die is determined based on the transient load conditions. The voltage droop may be compared to a voltage droop threshold of the design to determine whether or not to add mitigation techniques to the package device to reduce the associated voltage droop. For example, mitigation techniques are added when the determined voltage droop exceeds the voltage droop threshold. The mitigation techniques reduce the transient load conditions and maintain the magnitude of the net below the threshold voltage droop. Accordingly, operational errors and faults are reduced within the package device. Additionally, or alternatively, the design complexity of the package device may be reduced, reducing associated manufacturing cost of the package device.

In one example, a semiconductor device system comprises a first IC die. The first IC die is configured to operate in a first operating mode during a first period, and a second operating mode during a second period. The first period is associated with enabling an element of the first IC die and a first amount of voltage droop. The second period occurs after the first period and is associated with a second amount of voltage droop. The second amount of voltage droop is less than the first amount of voltage droop.

In one example, an IC die comprises a first circuit block and mitigation circuitry. The first circuit block is configured to operate in a first operating mode during a first period. The first period associated with enabling the first circuit block and a first amount of voltage droop. The circuit block is further configured to operate in a second operating mode during a second period. The second period occurs after the first period and is associated with a second amount of voltage droop. The second amount of voltage droop is less than the first amount of voltage droop. The mitigation circuitry is connected to the first circuit block, and is configured to control the first operating mode and the second operating mode.

In one example, a method for operating an IC die comprises operating in a first operating mode during a first period. The first period is associated with enabling an element of the IC die and a first amount of voltage droop. The method further comprises operating in a second operating mode during a second period. The second period occurs after the first period and is associated with a second amount of voltage droop. The second amount of voltage droop is less than the first amount of voltage droop.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein provide for integrated circuit (IC) devices that employ mitigation techniques to reduce transient load conditions and associated voltage droop.

The transient load conditions (e.g., a load current) of an IC die may be higher during an enablement period (e.g., a startup or gate clock release period) than during normal operating periods. In a package device having multiple IC dies, the IC dies act like one large integrated device through heterogeneous co-packaging. However, as the multiple IC dies act like one integrated device, the stress placed on a power distribution network (PDN) is increased. For example, the multiple IC dies have increased transient load conditions as compared to single IC die devices. The increased current draw due to the increased transient load results in voltage droop in the power supply network (e.g., a power supply device, and the PDN, among others). Voltage droop is a decrease in output voltage provided by the power supply. When the voltage droop exceeds a threshold voltage droop of a package device design, the corresponding output voltage provided by the power supply system is less than a required operating voltage of the package device. Accordingly, errors and faults may occur within the operation of the elements of the package device.

However, by reducing the transient load conditions of package device during a startup period, the corresponding voltage droop is reduced. Accordingly, errors and faults that may occur due to voltage droop are mitigated. For example, the clock frequency of one or more clock signals of a package device may be reduced during startup to reduce current draw and corresponding voltage droop. Further, the initiation of a startup period associated with a different circuit blocks and/or clock domains may be delayed with regard to each other to reduce current draw and corresponding voltage droop. In one example, the package device is configured to detect the corresponding voltage droop and, when the amount of voltage droop exceeds a voltage droop threshold, operate in an operational mode having a reduced current draw until the voltage droop is less than the voltage droop threshold.

Figure 1:
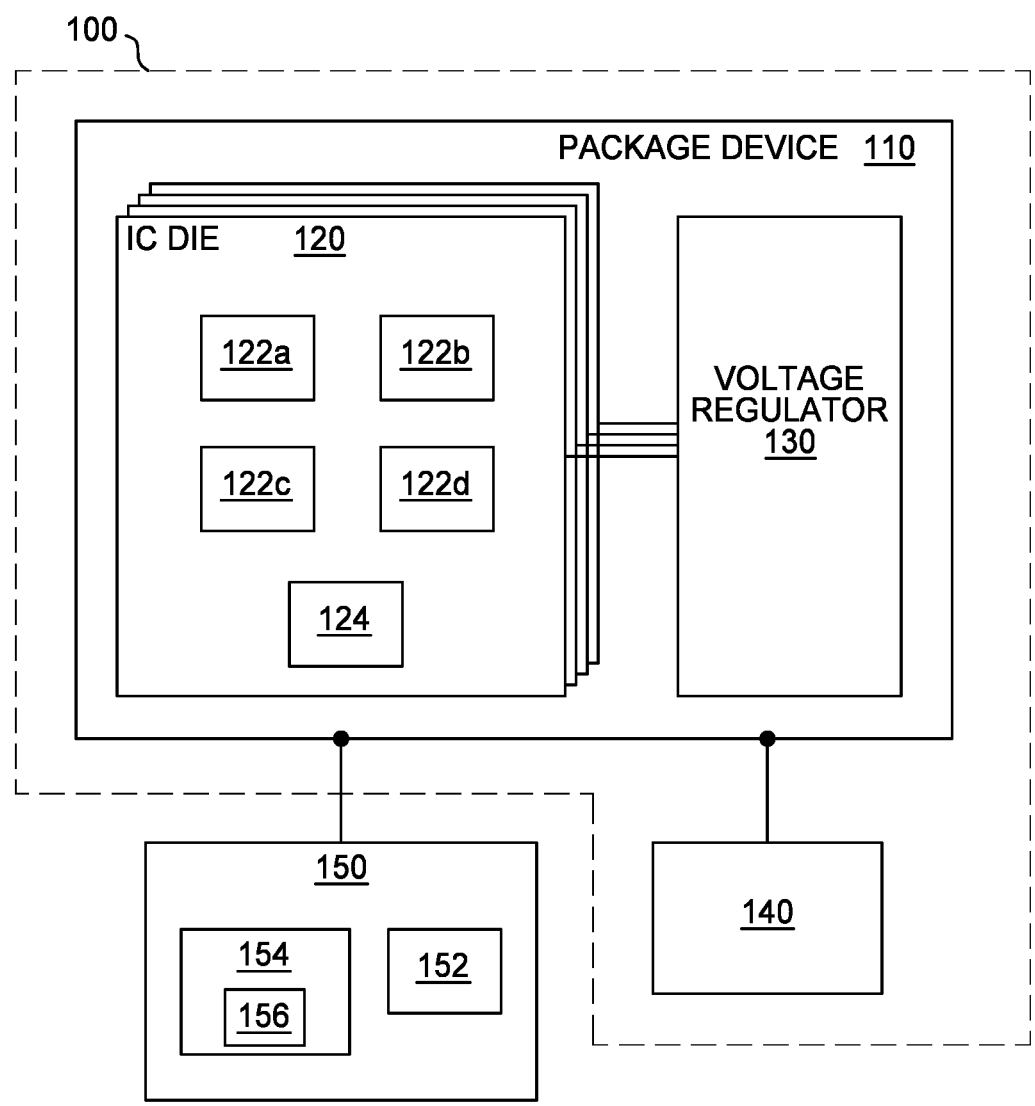
FIG. 1 is a block diagram depicting a semiconductor device system, according to one or more examples.

FIG. 1 illustrates an example semiconductor device system 100, according to one or more examples. The semiconductor device system 100 includes a package device 110 and a power supply 140. The package device 110 is connected to the power supply 140. The power supply 140 provides one or more power signals to the package device 110.

The package device 110 includes one or more IC dies 120 and a voltage regulator circuitry 130. The voltage regulator circuitry 130 is connected to the power supply 140. The voltage regulator circuitry 130 receives one or more power signals from the power supply 140. Further, the voltage regulator circuitry 130 generates one or more local power supply signals from the power supply signal provided by the power supply 140. The voltage regulator circuitry 130 includes circuit elements that generate the local power supply signals from the power supply signal or signals provided by the power supply 140. In one example, the voltage regulator circuitry 130 is external to the package device 110 (e.g., not included within the package device 110). In such an example, the voltage regulator circuitry 130 is communicatively coupled to the one or more IC dies 120 of the package device 110 and mounted to a common substrate with the one or more IC dies 120.

The voltage regulator circuitry 130 regulates the voltage of the power supply signals provided by the power supply 140. In one example, the voltage regulator circuitry 130 provides one or more regulated power signals and a ground signal to the IC dies 120. For example, the voltage regulator circuitry 130 provides one or more regulated power signals and a ground signal to a PDN of the IC dies 120. The power supply 140, the voltage regulator circuitry 130, and the PDN form a power supply system.

In one example, the one or more IC dies 120 includes a single IC die. In other examples, the one or more IC dies 120 includes two, three, or more than three IC dies. Each of the IC dies 120 may be similar or different from each other. One or more of the IC dies 120 is a field-programmable gate array (FPGA). One or more of the IC dies 120 is an FPGA including programmable portions and hard-wired portions. Further, one or more of the IC dies 120 is an application specific IC (ASIC). In one example, a first one or more IC dies 120 is an FPGA and a second one or more of the IC dies 120 is an ASIC. In one example, one or more of the IC dies 120 is a hardware acceleration engine or an artificial intelligence engine, among others.

In one example, each of the IC dies 120 includes one or more circuit blocks 122. For example, a first one of the IC dies 120 includes circuit blocks 122a-122d. In other examples, one or more IC die 120 includes more or less than four circuit blocks 122. Each of the IC dies 120 may include a common number of circuit blocks 122 or a different number of circuit blocks 122. The circuit blocks 122 control the operation of the IC die 120. One or more of the circuit blocks 122 of an IC die is a programmable logic block. Further, one or more of the circuit blocks 122 of an IC die includes static logic. The programmable logic block includes programmable circuitry or logic that is reconfigurable. The static logic remains static while the programmable circuitry is reconfigured between different configurations.

The circuit blocks 122 of an IC die and/or between IC dies are connected to each other via one or more intra-die interfaces and buses. Further, different IC dies 120 are connected to each other via inter-die interfaces. The inter-die interface is a high speed bus connection.

At least one of the one or more IC dies 120 includes mitigation circuitry 124. The mitigation circuitry 124 of an IC die 120 is connected to the circuit blocks 122 of the IC die and/or to a different IC die 120. In one example, the mitigation circuitry 124 controls an operating mode of the IC die 120 and the circuit blocks 122 of the IC die. For example, the mitigation circuitry 124 controls one or more of parameters selected from a group consisting of one or more clock signals, enablement timing of clock domains, and enablement of the circuit block 122, among others, to control the net voltage droop associated with an IC die and package device by controlling the transient load conditions of the ID die and package device.

In one example, the mitigation circuitry 124 is formed from the programmable circuitry (logic) of an IC die such that the programmable circuitry of an IC die comprises the mitigation circuitry 124. In such an embodiment, the mitigation circuitry 124 includes programmable circuitry. In other examples, at least a portion of the mitigation circuitry 124 is static circuitry of an IC die.

The mitigation circuitry 124 generates the clock control signals based on one or more parameters. For example, the parameters may be timing parameters that the mitigation circuitry 124 utilizes to generate a clock control signal to control the frequency of a corresponding clock signal. In one example, the mitigation circuitry 124 alters the 1's and 0's within a clock control signal based on the parameters to control the frequency of the clock signal. For example, increasing the ratio of 1's relative to 0's within the clock control signal increases the frequency of a corresponding clock signal. The mitigation circuitry 124 further controls the timing of enabling the IC dies 120 and/or circuit blocks 122 based on the one or more parameters. Further, the mitigation circuitry 124 further controls the timing of enabling different clock domains of an IC die 120 based on the one or more parameters.

In one example, each of the IC dies 120 includes a respective mitigation circuitry 124. The mitigation circuitry 124 of each IC die 120 controls the parameters of each respective IC die 120 to control the net voltage droop of the respective IC die by controlling the transient load conditions of the ID die. In one example, a first mitigation circuitry 124 of a first IC die of the IC dies 120 controls the first IC die with first parameters, and a second mitigation circuitry 124 of a second IC die of the IC dies 120 controls the second IC die with second parameters that differ from the first parameters as the voltage droop and/or power requirements of the first and second IC dies differ from each other. In one example, the mitigation circuitry 124 of each respective IC die controls the respective IC die with different parameters as the voltage droop and/or power requirements of each IC die differ from each other.

Figure 2:
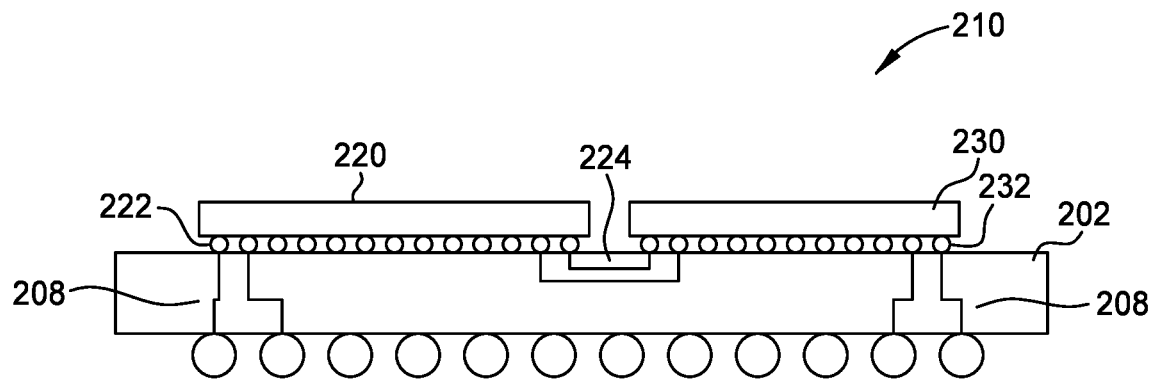
FIG. 2 illustrates package device, according to one or more examples.

FIG. 2 illustrates an example package device 210, according to one or more embodiments. The package device 210 includes an IC die 220, a voltage regulator 230, and a substrate 202. The IC die 220 is configured similar to the IC dies 120 of FIG. 1. Further, the package device 210 is configured similar to the package device 110. The IC die 220 is mounted to the substrate 202 via bumps 222 and the voltage regulator is 230 is mounted to the substrate 202 via bumps 232. The bumps 222 and/or the bumps 232 are C4 bumps. In other examples, other types of bumps may be utilized. The IC die 220 is connected to the voltage regulator 230 via communication paths 224. The communication paths 224 are formed in one or more layers in the substrate 202 and between respective bumps 222 and 232. Further, one or more of the bumps 222 and/or one or more of the bumps 232 are connected via communication pathways 208 to bumps 206 on the substrate 202. The IC die 220 and/or the voltage regulator 230 communicate with devices external to the package device 210 via the communication pathways 208. For example, the voltage regulator 230 is connected to a power supply (e.g., the power supply 140) via one or more of the communication pathways 208. Further, the IC die 220 may be connected to a computer system (e.g., the computer system 150) via one or more of the communication pathways 208.

Figure 3:
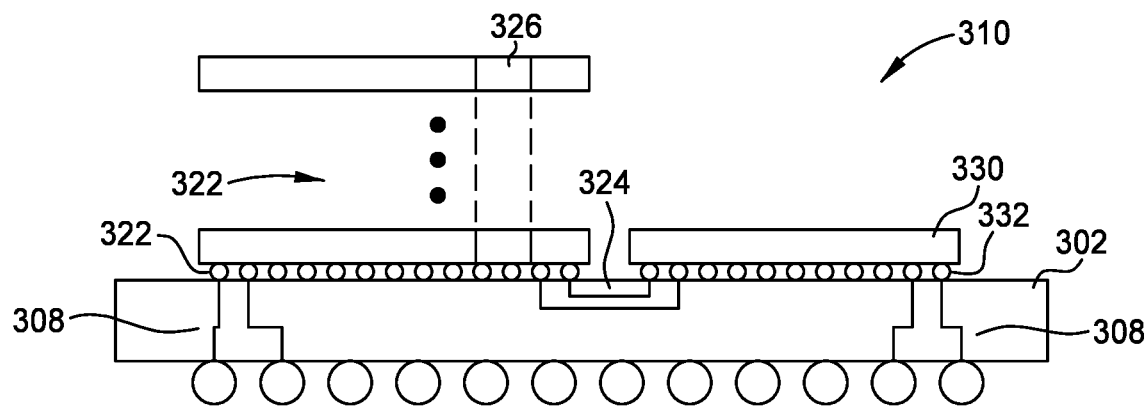
FIG. 3 illustrates package device, according to one or more examples.

FIG. 3 illustrates an example package device 310, according to one or more examples. The package device 310 includes IC dies 320, voltage regulator 330, and substrate 302. The IC dies 320 include two or more IC dies vertically stacked on each other forming a three dimensional die stack. The IC dies 320 are connected to each other via a PDN 326. The PDN 326 includes one or more through silicon vias (TSVs) that are used to form the connections between the IC dies 320. In one example, power supply signals provided by the voltage regulator 330 are communicated to each of the IC dies 320 via one or more of the TSVs of the PDN 326. The IC dies 320 are mounted to the substrate 302 via bumps 322 and the voltage regulator 330 is mounted to the substrate 302 via bumps 332. The bumps 322 and/or the bumps 332 are C4 bumps. In other examples, other types of electrical connections may be utilized. The IC dies 320 are connected to the voltage regulator 330 via communication paths 324. The communication paths 324 are formed in one or more layers in the substrate 302 and between respective bumps 322 and 332. Further, one or more of the bumps 322 and/or one or more of the bumps 332 are connected via communication pathways 308 to bumps 306 on the substrate 302. The IC dies 320 and/or the voltage regulator 330 communicate with devices external to the package device 310 via the communication pathways 308. For example, the voltage regulator 330 is connected to a power supply (e.g., the power supply 140) via one or more of the communication pathways 308. Further, the IC dies 320 are connected to a computer system (e.g., the computer system 150) via one or more of the communication pathways 308.

With further reference to FIG. 1, the package device 110 is connected to the computing system 150. The computing system 150 includes controller 152 and a memory 154. The computing system 150 configures the one or more IC dies 120 and/or the voltage regulator circuitry 130. For example, the bitstream 156 stored in the memory 154 is communicated to the one or more IC dies 120 and/or the voltage regulator circuitry 130. In one example, the bitstream 156 configures a functionality of the one or more IC dies 120. In another example, the bitstream 156 configures a functionality the voltage regulator circuitry 130. Further, the bitstream 156 configures a functionality of the one or more IC dies 120 and a functionality of the voltage regulator circuitry 130. Configuring the functionality of the one or more IC dies 120 may include configuring the functionality of one or more programmable logic blocks of the circuit blocks 122. In one example, the bitstream 156 is utilized to configure the mitigation circuitry 124.

An application is executed by the controller 152 to generate the bitstream 156. The bitstream 156 is generated based on one or more parameters. The parameters correspond to properties of the package device 110. The parameters may correspond to the power constraints of the package device 110. In one example, the bitstream 156 configures the one or more IC dies 120 to reduce voltage droop during a power on stage. For example, the bitstream 156 is utilized to configure the mitigation circuitry 124 to reduce voltage droop during a power on stage.

Voltage droop occurs as the transient load driven by a power supply (e.g., the power supply 140) increases. The transient load conditions may vary as the number of IC dies and/or circuit blocks of an IC die are simultaneously enabled. For example, the voltage droop that associated with one of the IC dies 120 being enabled is less than the voltage droop that is associated with two of the IC dies 120 being enabled. Further as different circuit blocks within an IC die 120 are enabled, the associated voltage drop may increase. For example, the voltage droop associated with the circuit block 122a being enabled is less than the voltage droop that associated with the circuit blocks 122a and 122b being enabled. As is noted above, in various instances, the net voltage droop (e.g., a combined voltage droop associated with different IC dies 120 and/or circuit blocks 122 being enabled) may exceed a threshold voltage droop. In such instances, errors and/or faults may occur within the operation of the package device 110. Accordingly, the mitigation circuitry 124 controls one or more parameters associated with enabling the IC dies 120 and/or the circuit block 122 to reduce the transient load conditions and the associated net voltage droop.

Figure 4:
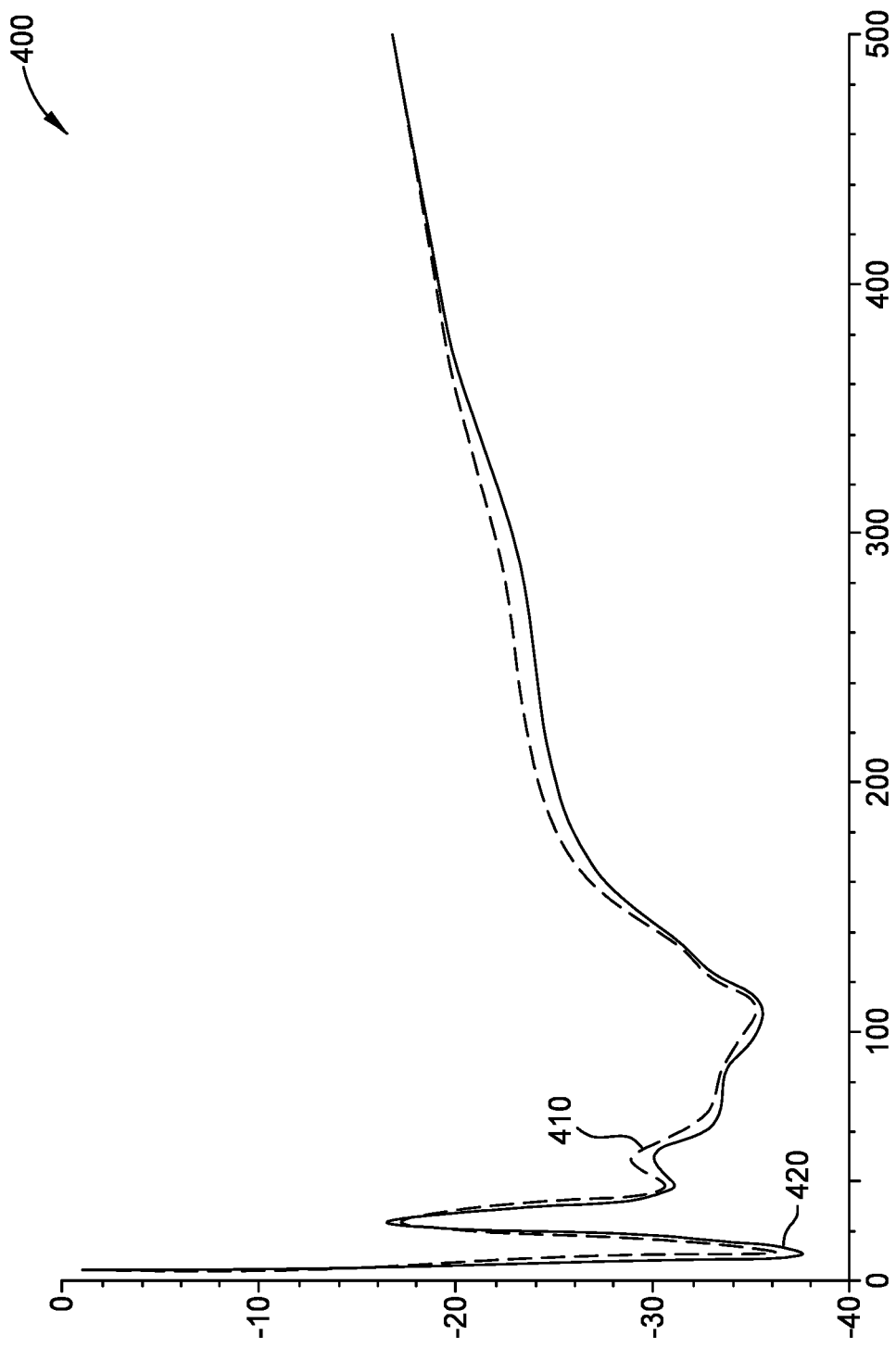
FIG. 4 is a graph of example voltage droop, according to one or more examples.

FIG. 4 illustrates an example graph 400 of voltage droop that may occur based on different elements of a package device (e.g., the package device 110) being enabled. Line 410 corresponds to the voltage droop that occurs based on one of the IC dies 120 being enabled and the line 420 corresponds to the voltage droop that occurs based on two of the IC dies 120 being simultaneously enabled. As is illustrated by lines 410 and 420, as more corresponding IC dies 120 are simultaneously enabled, the magnitude of the net voltage droop increases. Further, over time (e.g., from 0 ms to 500 ms), the magnitude of the net voltage droop levels off and decreases as the transient load conditions decrease.

In various examples, if the voltage droop exceeds (e.g., a magnitude of the voltage droop) a threshold voltage droop, errors and/or faults may occur within the operation of the IC dies 120. The threshold voltage droop may correspond to a maximum voltage droop of the package device 110. In one example, with reference to FIG. 4, the threshold voltage droop is −37 V. In such an example, the voltage droop according to line 410 does not exceed the threshold voltage droop. However, the voltage droop according to line 420 does exceed the threshold voltage. Accordingly, as two more of the IC dies 120 are enabled, the corresponding net voltage droop exceeds the voltage droop threshold and errors and/or faults within the IC dies 120 may occur.

In one example, the net voltage droop may be reduced by reducing the clock frequency of one or more clock signals of an IC die or dies. For example, mitigation circuitry of an IC die controls a clock signal or signals of the die to have a reduced clock frequency for while the IC die is enabled. In one embodiment, the clock frequencies for higher power circuit blocks within an IC die 120 or package device are reduced when enabling the IC die 120.

Figure 5A:
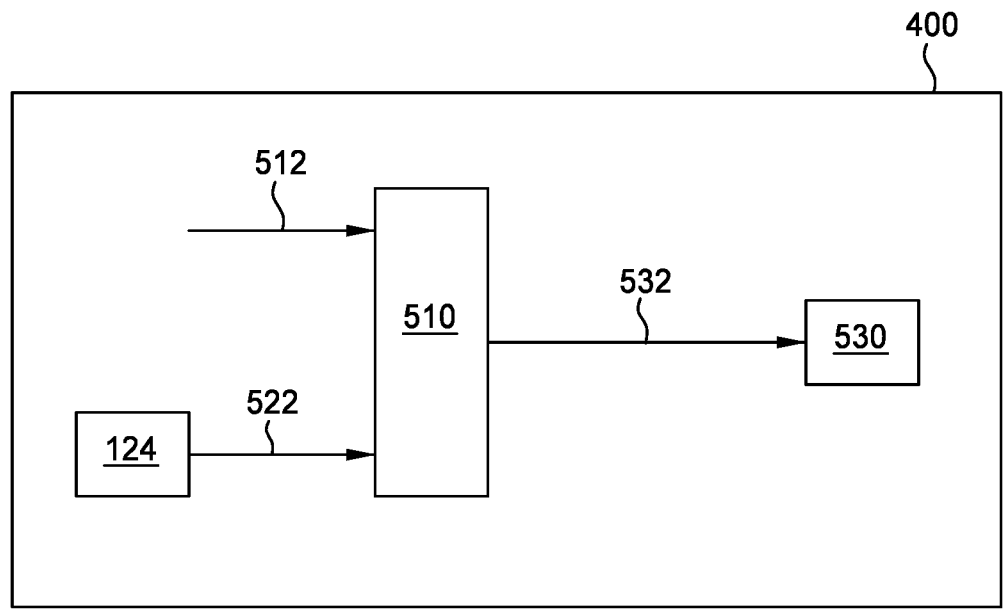
FIG. 5A is a block diagram of an integrated circuit (IC) die, according to one or more examples.

FIG. 5A illustrates an IC die 500, according to one or more embodiments. The IC die 500 is one of the IC dies 120 of the package device 110 of FIG. 1. The IC die 500 includes clock generation circuitry 510, the mitigation circuitry 124, and circuit block 530. The circuit block 530 is one of the circuit blocks 122 of FIG. 1. The clock generation circuitry 510 includes phase-lock loop (PLL) circuitry or delay-locked loop (DLL) circuitry. In examples where the clock generation circuitry 510 is a PLL, the clock generation circuitry 510 includes a voltage controlled oscillator (e.g., VCO). In examples where the clock generation circuitry 510 is a DLL, the clock generation circuitry 510 includes one or more delay taps and an output divider.

The clock generation circuitry 510 generates the clock signal 532 and outputs the clock signal 532 to the circuit block 530. The clock generation circuitry 510 receives a clock signal 512, and a clock control signal 522 from the mitigation circuitry 124. The clock generation circuitry 510 generates the clock signal 532 based on the clock signal 512 and the clock control signal 522. The clock signal 512 is a free-running clock signal and provides a clock source to the clock generation circuitry 510. The clock signal 512 is generated by the IC die 500. In one example, the clock signal 512 is generated external to the IC die 500 and communicated to the IC die 500.

Figure 5B:
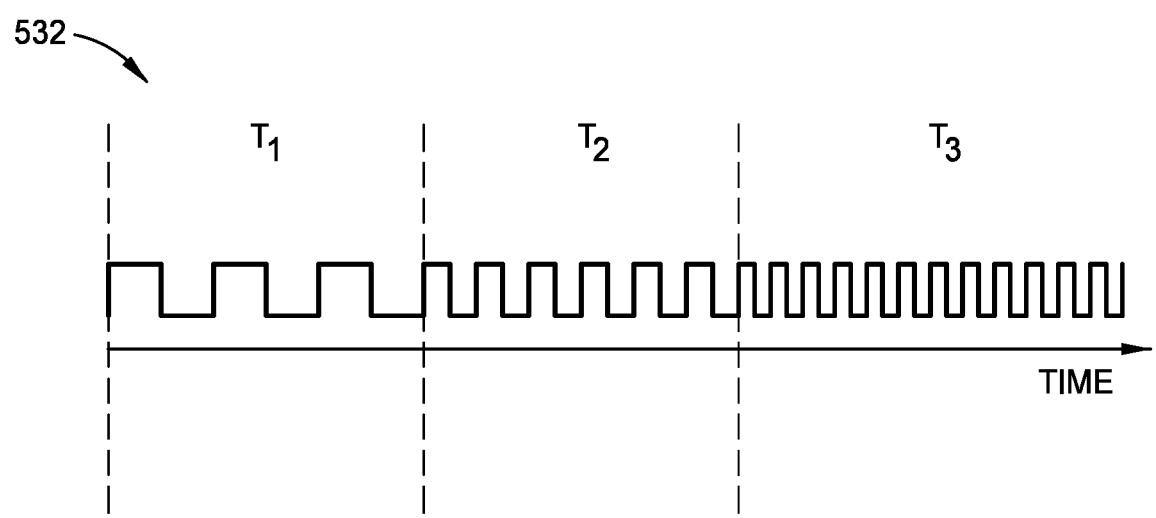
FIG. 5B is an example clock signal, according to one or more examples.

The mitigation circuitry 124 includes one or more counters, one or more comparators, and other logic configured to delay full clock frequency enablement for a period of time. The period of time may correspond to the voltage droop caused by one or more IC dies or corresponding circuit elements. The mitigation circuitry 124 controls one or more parameters of the clock generation circuitry 510 to control the frequency of the clock signal 532. For example, the mitigation circuitry 124 reprograms (e.g., reconfigures) one or more of the multiple factors and/or divide factors of the VCO of the clock generation circuitry 510 to control the frequency of the clock signal 532. Controlling the frequency of the clock signal 532 includes altering the frequency of the clock signal 532 such that over one or more time periods, the frequency of the clock signal 532 is reduced from the normal operating frequency. FIG. 5B illustrates the clock signal 532. As is illustrated, the clock signal 532 has three different frequencies. A first frequency corresponds to time period $T_1$, a second frequency corresponds to time period $T_2$, and a third frequency corresponds to time period $T_3$. The first frequency is less than the second frequency and the second frequency is less than the third frequency. The third frequency corresponds to the normal and final operating frequency of the clock signal 532. Operating the clock signal 532 at a reduced frequency reduces the associated transient load conditions of the circuit block 530, reducing the associated net voltage droop.

A length of the time period $T_1$ is greater than, less than, or longer than the time period $T_2$. Altering the length of the time periods alters the transient load conditions of the circuit block 530, altering the associated net voltage droop. For example, increasing the length of the time period $T_1$, or the time period $T_2$, reduces the associated net voltage droop. However, operating at the reduced frequency of the time period $T_1$ (e.g., the first frequency) may negatively affect the operation of the IC die 500. By using one or more intermediate frequencies (e.g., the second frequency of the time period $T_2$, the net voltage droop may be controlled while reducing negative effects to the operation of the IC die 500.

FIG. 5B illustrates three time periods (e.g., time periods $T_1$, $T_2$, and $T_3$) with three associated frequencies, however, in other examples, the clock signal 532 may have more than or less than three different frequencies and associated time periods. In one example, the clock signal 532 includes two or more different frequency and associated time periods.

Each different frequency may be referred to as a frequency step. For example, each of the time periods $T_1$, $T_2$, and $T_3$ and associated frequency may be referred to as different frequency step.

As is noted above, reducing the frequency of the clock signal 532 reduces the corresponding power draw and an associated voltage droop of the circuitry 430. For example, reducing the frequency of the clock signal 532 reduces the current draw of the circuit block 530, reducing the change in current over a period of time. In one example, when enabling the IC die 500, the clock generation circuitry 510 begins to generate the clock signal 532. Further, the mitigation circuitry 124 generates the clock control signal 522. The clock control signal 522 includes instructions for the clock generation circuitry 510 to adjust the frequency of the clock signal 532. For example, the clock control signal 522 includes instructions for the clock generation circuitry 510 that instruct the clock generation circuitry 510 to reduce a frequency of the clock signal 532 as indicated by the time periods $T_1$ and $T_2$ of FIG. 5B. The mitigation circuitry 124 instructs the clock generation circuitry via the clock control signal 522 to increase the frequency of the clock signal 532 over a period of time. For example, from the first frequency of the time period $T_1$ to second frequency of the time period $T_2$, and from the second frequency of the time period $T_2$ to the third frequency of the time period $T_3$. Accordingly, the frequency of the clock signal 532 has one or more frequency steps or steps. The frequency of the clock signal 532 is increased over one or more steps until the frequency of the clock signal 532 reaches a predetermined frequency. The predetermined frequency of the circuitry 430 is the normal operating frequency of the circuitry 430. The mitigation circuitry 124 controls the frequency of the clock signal 532 such that the net voltage droop of the IC die 500 does not exceed a threshold net voltage droop of the IC die 500.

In one example, the clock generation circuitry 510 increases the frequency of the clock signal 532 over a period of time based on the clock control signal 522 as is illustrated in FIG. 5B.

In various examples, the clock generation circuitry 510 generates two or more clock signals from the clock signal 512 and the clock control signal or signals received from the mitigation circuitry 124. The two or more clock signals may have similar frequency steps. Alternatively, at least one of the two or more clock signals have at least one different frequency step. For example, at least one clock signals has an additional frequency step than another clock signal, a different frequency in a frequency step, and/or a different length of a frequency step.

Figure 6:
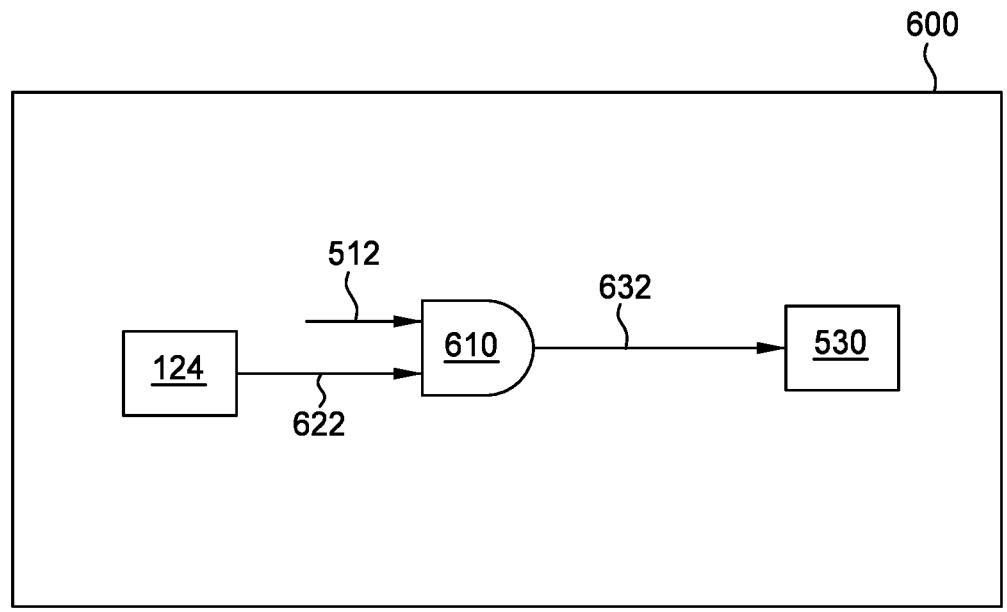
FIG. 6 is a block diagram of an IC die, according to one or more examples.

In one example, clock gating may be utilized to control the frequency of a clock signal. For example, as illustrated in FIG. 6, the IC die 600 includes an AND gate 610, the mitigation circuitry 124, and the circuit block 530. The AND gate 610 receives the clock signal 512 and a clock control signal 622 from the mitigation circuitry 124. The AND gate 610 outputs the clock signal 632 based on the clock signal 512 and the clock control signal 522. The mitigation circuitry 124 controls the frequency of the clock signal 632 by varying the clock control signal 622. For example, the mitigation circuitry 124 controls the transitions of the clock control signal 622 to set the value of the clock control signal 622 to either be a high value (e.g., a logical one) or a low value (e.g., a logical zero).

The AND gate 610 receives the clock signal 512 and the clock control signal 622. The AND gate 610 generates the clock signal 632 based on the clock signal 512 and the clock control signal 622. In one example, based on the clock signal 512 and the clock control signal 622 having a value of a logical one, the clock signal 632 has a high value. Further, based on the clock signal 512 or the clock control signal 522 having a low value, the clock signal 532 has a low value. Controlling the timing increments between logical ones of the clock control signal 622 controls the frequency of the clock signal 532. Increasing the time increment that the clock control signal 522 has a value of a logical one, increases the frequency of the clock signal 632 over a corresponding time period. Accordingly, in one example, by controlling when the value of the clock control signal 622, the clock signal 632 is controlled to have two or more frequencies. In one example, when enabling the IC die 600, the time interval between logical ones of the clock control signal 622 is greater than the time interval between logical ones of the clock signal 632 during a period of time after the IC die 600 is enabled. Accordingly, the frequency of the clock signal 632 is reduced when enabling the IC die 500 and the net voltage droop of associated with the IC die 600 is reduced.

While the example of FIG. 6 illustrates a single AND gate 610, clock control signal 622 and clock signal 632, in other examples, the IC die 600 includes two or more AND gates 610 that generate respective clocks signals 632 based on the clock signal 512 and respective clock control signal 622. The two or more clock signals may have similar frequency steps. Alternatively, at least one of the two or more clock signals has at least one different frequency step. For example, at least one clock signals has an additional frequency step than another clock signal, a different frequency in a frequency step, and/or a different length of a frequency step.

Figure 7:
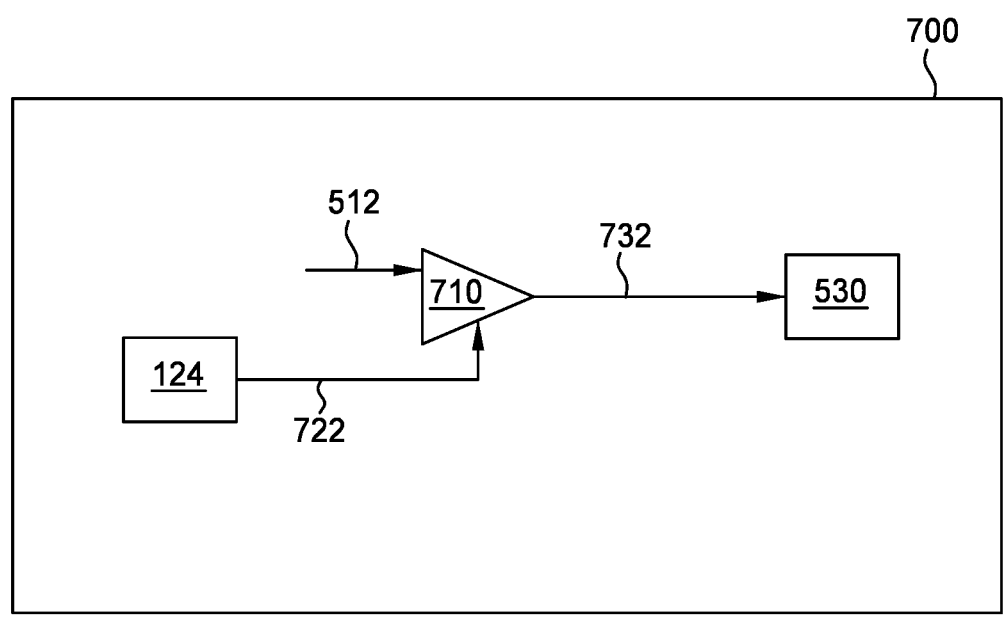
FIG. 7 is a block diagram of an IC die, according to one or more examples.

FIG. 7 illustrates an IC die 700 including a buffer 710 configured to generate the clock signal 732. The buffer 710 receives the clock signal 512 and the clock control signal 722 from the mitigation circuitry 124. The buffer 720 generates the clock signal 732 from the clock signal 512 and the clock control signal 722. The buffer 710 outputs the clock signal 732 to the circuit block 530. The buffer 710 controls the frequency of the clock signal 732 based on the clock control signal 722. For example, when enabling the IC die 700, the mitigation circuitry 124 instructs the buffer 710 via the clock control signal 722 to generate the clock signal 732 with a reduced frequency. Reducing the frequency of the clock signal 732 reduces the corresponding net voltage droop of the circuit block 530. In one example, the mitigation circuitry 124 instructs the buffer 710 to increase the frequency of the clock signal 732 over a period of time after starting to enable the IC die 700. The mitigation circuitry 124 instructs the buffer 710 to increase the frequency of the clock signal 732 over one or more frequency steps. For example, the buffer 710 generates the clock signal 732 to have one or more frequency steps similar to that of the clock signal 532 of FIG. 5B. The mitigation circuitry 124 instructs the buffer 710 to increase the frequency of the clock signal 732 until the frequency of the clock signal 732 reaches the predetermined (e.g., desired) operating frequency. In one example, the mitigation circuitry 124 controls the frequency at which the buffer 710 is enabled via the clock control signal 722 to control the frequency of the clock signal 732. Increasing the frequency at which the buffer 710 is enabled increases the frequency of the clock signal 732.

While the example of FIG. 7 illustrates a single buffer 710, clock control signal 722, and clock signal 732, in other examples, the IC die 700 includes two or more buffers 710 that generate respective clocks signals 732 based on the clock signal 512 and respective clock control signal 722. The two or more clock signals may have similar frequency steps. Alternatively, at least one of the two or more clock signals has at least one different frequency step. For example, at least more clock signals has an additional frequency step than another clock signal, a different frequency in a frequency step, and/or a different length of a frequency step.

Figure 8:
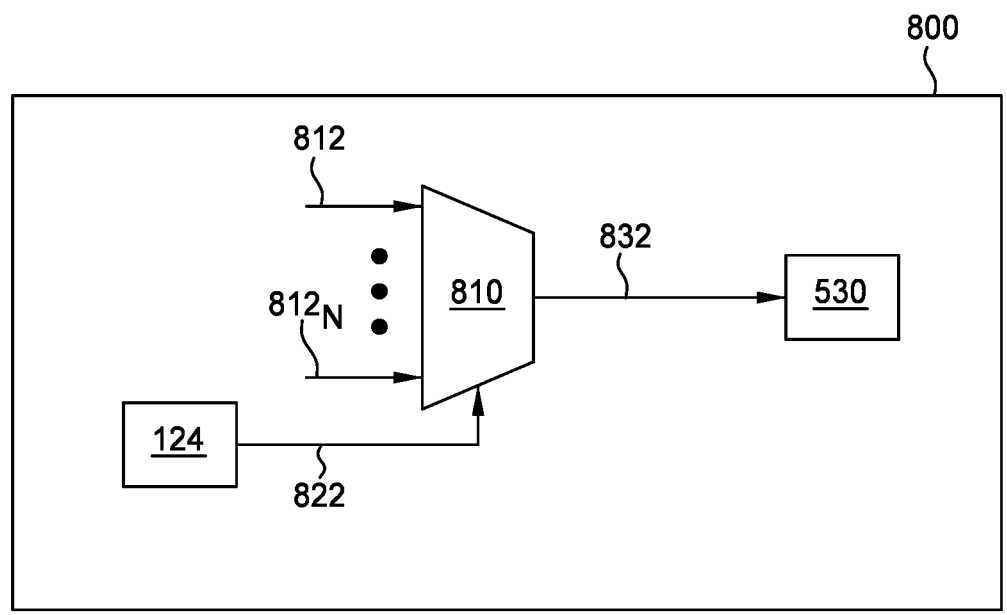
FIG. 8 is a block diagram of an IC die, according to one or more examples.

FIG. 8 illustrates an IC die 800 including a selection circuitry 810, mitigation circuitry 124, and circuit block 530. The selection circuitry 810 receives two or more clock signals 8121, 812N. N is an integer greater than or equal to two. The selection circuitry 810 is connected to the mitigation circuitry 124 and receives the clock control signal 822 from the mitigation circuitry 124. The clock control signal 822 controls the selection circuitry 810 to select between the clock signals 812₁, 812N. In one example, the selection circuitry 810 is a multiplexer (MUX). In another example, the selection circuitry 810 includes one or more switches.

Each of the clocks signal 812 has a different frequency. In one example, the mitigation circuitry 124 instructs the selection circuitry 810 to select the clock signal 812 having the lowest frequency via the clock control signal 822 when enabling the IC die 800 to reduce the net voltage droop due to the circuit block 530. Over one or more time periods after enabling of the IC die 800 is initialized, the mitigation circuitry 124 instructs the selection circuitry 810 to select from the clock signals 812, clock signals that have increasing frequencies such that the frequency of the clock signal 832 increases. The mitigation circuitry 124 instructs the selection circuitry 810 to select clock signals 812 having increased frequencies until the frequency of the clock signal 832 reaches a predetermined (e.g., desired) operating frequency. Selecting different ones of the clock signals 812 over different time periods generates a clock signal 832 having different frequency steps. In one example, the mitigation circuitry 124 controls the selection circuitry 810 to maintain the frequency of the clock signal 832 at a level that maintains the voltage droop associated with the circuit block 530 to be less than (e.g., not satisfying) a threshold voltage droop.

While the example of FIG. 8 illustrates a selection circuitry 810, clock control signal 822, and clock signal 832, in other examples, the IC die 800 includes two or more selection circuitry 810 that generate respective clocks signals 832 based on the clock signals 812 and respective clock control signal 822. The two or more clock signals may have similar frequency steps. Alternatively, at least one of the two or more clock signals has at least one different frequency step. For example, at least one of the two or more clock signals has an additional frequency step than another clock signal, a different frequency in a frequency step, and/or a different length of a frequency step. In one example, each of the selection mechanisms receives a different group of clock signals 812 for selection and to be used to generate the clock signal 832.

In one or more examples, the embodiments of FIGS. 5-8 may be utilized when one or more clock signals are being stopped to ensure that voltage overshoot does not occur.

The net voltage droop associated with an IC die or dies (e.g., one or more of the IC dies 120a) may be reduced by adding a timing offset between the initialization of an enablement (e.g., startup or gate release period) of one or more of the circuit blocks 122. For example, one or more of the circuit blocks 122 includes a super logic region (SLR). An SLR includes active circuitry of the corresponding IC die 120. An SLR includes one or more look-up tables (LUTs), one or more registers, one or more input/output (I/O) components, transceiver circuitry, block memory, and/or one or more signal processing blocks, among others. The SLR may include static and/or programmable logic. With further reference to FIG. 1, the circuit blocks 122 of an IC die 120 are configured to communicate with each other such that as two or more of the circuit blocks are enabled during different, non-overlapping, periods. Further, ready signals may be communicated between the circuit blocks 122 to control the sequential enabling of the circuit blocks 122. For example, the circuit block 122a communicates a ready signal to the circuit block 122b based on the circuit block 122a being enabled. In one example, at least one of the circuit blocks 122 is enabled after another one of the circuit blocks 122. Limiting the number of circuit blocks 122 that are enabled during an overlapping period of time, reduces a corresponding change in current draw and transient load condition, reducing the corresponding net voltage droop.

Figure 9:
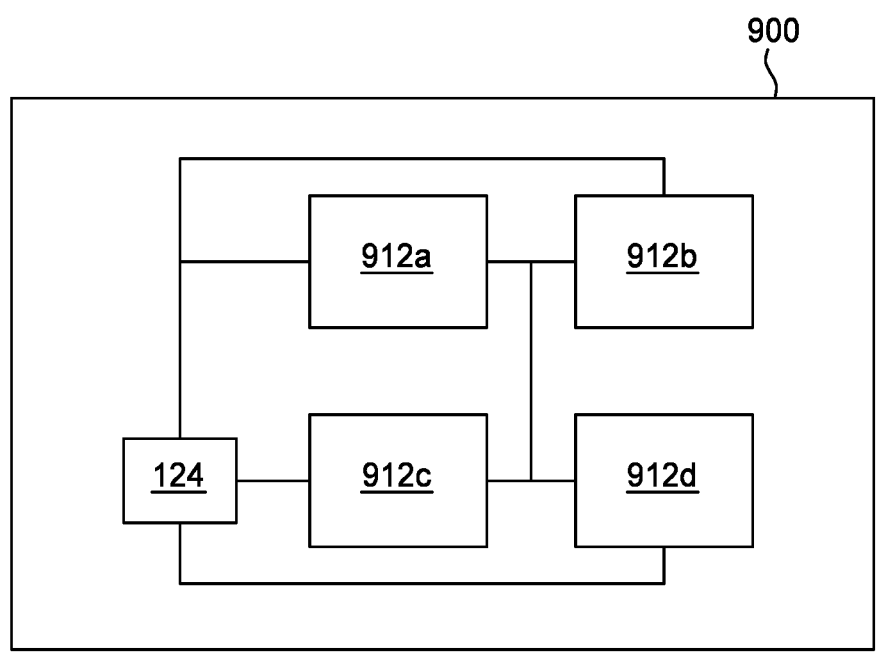
FIG. 9 is a block diagram of an IC die, according to one or more examples.

In one example, with reference to FIG. 1, two or more of the circuit blocks 122 of the IC die 120 are enabled at different times. For example, the circuit block 122a is enabled before the circuit block 122b. In one example two or more of the circuit blocks 122 are enabled during an at least partially overlapping period and one or more of the circuit blocks 122 is enabled during a different, non-overlapping period. FIG. 9 illustrates IC die 900 including circuit blocks 912a-912d and mitigation circuitry 124. The IC die 900 is one of the IC dies 120 of FIG. 1 and the circuit blocks 912 are configured similar to those of the circuit blocks 122 of FIG. 1. The mitigation circuitry 124 is connected to each of the circuit blocks 912a-912d. Further, the circuit blocks 912 are connected to each other. The mitigation circuitry 124 controls when each of the circuit blocks 912a-912d is enabled with a clock control signal. Controlling when each of the circuit blocks 912a-912d is enabled controls the corresponding transient load condition (e.g., stepload) and voltage droop associated with each circuit block. Accordingly, by enabling the circuit blocks 912a-912d at different times, the net voltage droop is reduced as compared to enabling all of the circuit blocks 912a-912d at the same time. Further, in one example, at least two of the circuit blocks 912a-912b, but less than all of the circuit blocks, are enabled during an overlapping period of time. In another example, each of the circuit blocks 912a-912b is enabled during different periods. The clock control signal or signals control which circuit blocks are enabled and/or when the circuit blocks are enabled. Further, in one example, the clock for each of the circuit blocks 912a-912b is active even if the circuit blocks are not enabled.

In example, the mitigation circuitry 124 enables a first one of the circuit blocks 912 which enables a second one of the circuit blocks 912. This continues until each of the circuit blocks 912 are enabled. For example, the mitigation circuitry 124 enables the circuit block 912a via a corresponding control signal. When the circuit block 912a is enabled, the circuit block 912a enables the circuit block 912b via a corresponding control signal.

In one example, different portions (e.g., different domains) of the clocking network of one or more of the IC dies 120 are enabled in steps to minimize the corresponding transient load conditions and associated net voltage droop. For example, the during different time periods, different portions of the clocking network are enabled such that the corresponding net voltage droop is maintained below a voltage droop threshold for the semiconductor device system 100. In one example, as the enablement process moves forward in time, additional portions of the clocking network of one or more IC dies 120 are enabled in steps until the entire clock network is enabled.

Figure 10:
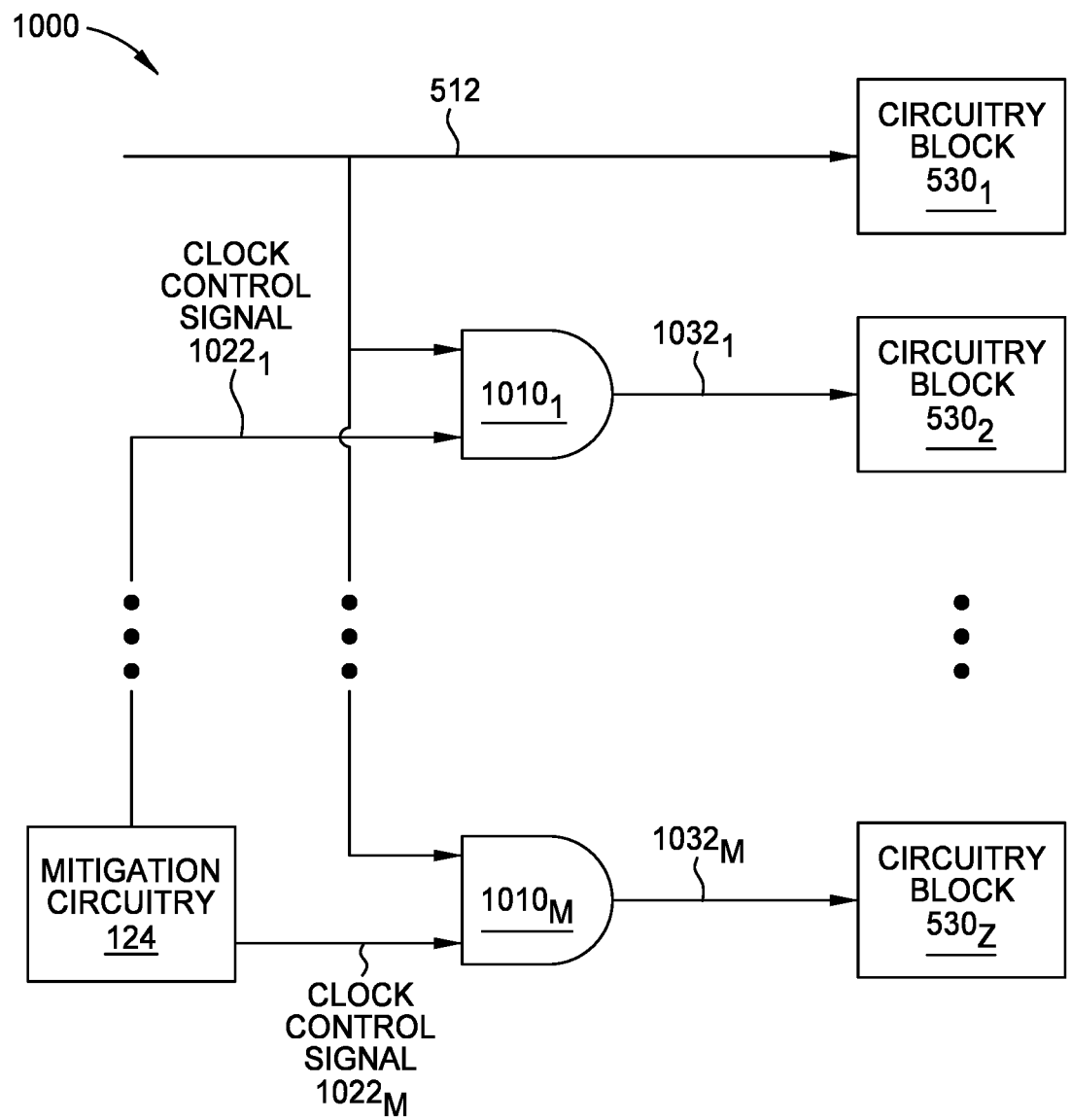
FIG. 10 is a block diagram of an IC die, according to one or more examples.

FIG. 10 illustrates a portion 1000 of an IC die (e.g., one or more of the IC dies 120). The portion 1000 includes AND gate 1110₁, AND gate 1110$_M$, the mitigation circuitry 124, and circuit blocks 530₁, 530₂, and 530$_Z$. M is an integer greater than 1 and Z is an integer greater than 2. In one example, AND gate 1110$_M$ and circuit block 530$_Z$ may be omitted.

Each of the circuit blocks 530 receives a respective clock signal. For example, the circuit block 530₁ receives the clock signal 512, the circuit block 530₂ receives the clock signal 1032₁, and the circuit block 530$_Z$ receives the clock signal 1032$_M$. Accordingly, the clock signal of the circuit block 530₁ corresponds to the clock signal 512. In one example, one or more of the clock signals 512, $1032_1$, $1032_M$ are input to two or more circuit blocks 530.

The clock signal $1032_1$ is provided by the AND gate $1110_1$ and the clock signal $1032_M$ is generated by the AND gate $1110_M$. For example, the AND gate $1110_1$ receives the clock signal 512 and the clock control signal $1022_1$ from the mitigation circuitry 124. The AND gate $1110_1$ receives the clock signal 512 and the clock control signal $1022_1$ and generates the clock signal $1032_1$. The mitigation circuitry 124 adjusts the clock control signal $1022_1$ to enable the AND gate $1110_1$ and generate the clock signal $1032_1$. For example, with reference to when the clock signal 512 is provided to the circuit block $530_1$, the clock signal $1032_1$ is provided to the circuit block $530_2$ at a later point in time.

The mitigation circuitry 124 generates the clock control signal $1022_M$ and controls the clock signal $1032_M$ similar to as described above with regard to the clock control signal $1022_1$ and the clock signal $1032_1$. Further, the AND gate $1110_M$ generates the clock signal $1032_M$ similar to as described above with regard to the AND gate $1110_1$ and the clock signal $1032_1$. The clock signal $1032_M$ is provided to the circuit block $530_Z$ after the clock signal 512 is provided to the circuit block $530_1$ and before or after the clock signal $1032_1$ is provided to the circuit block $530_2$.

In another example, physical boundaries in one or more IC dies may be used to define a startup sequence of the circuit blocks (e.g., circuit blocks 122). The startup sequence periodically enables portions of the clock network defined by the physical boundaries. Examples of the boundaries include clock leafs, physical clock domains, and different IC dies, among others.

Figure 11:
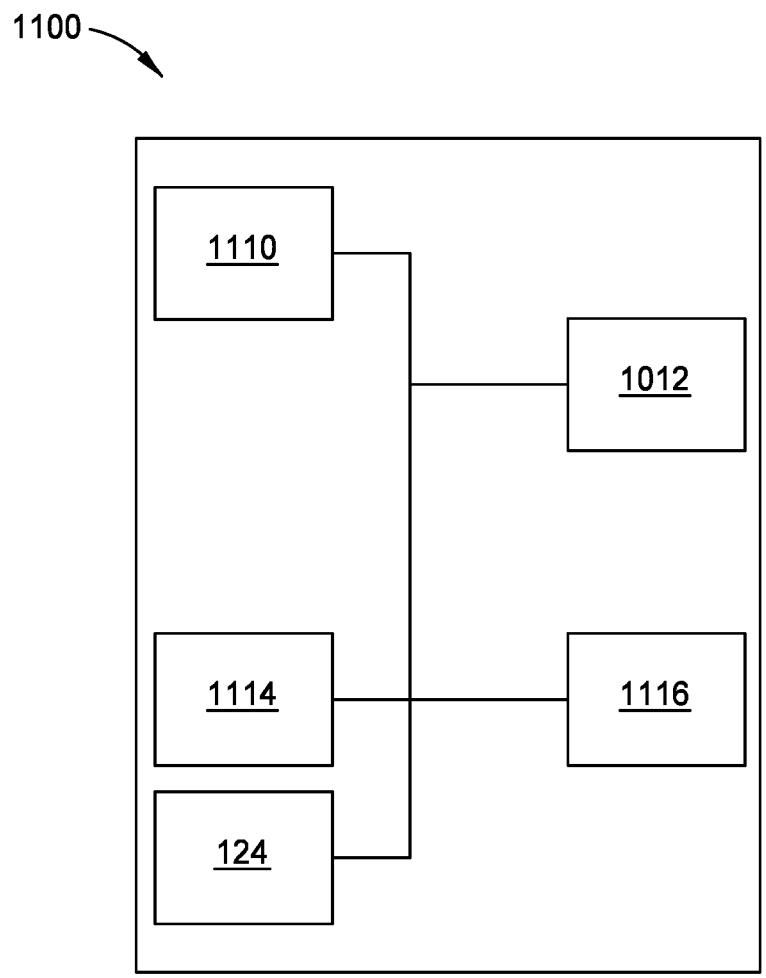
FIG. 11 is a block diagram of an IC die, according to one or more examples.

FIG. 11 illustrates a package device 1100. In the example of FIG. 11, the clock domain of the package device 1100 is partitioned based on different physical regions, e.g., physical regions 1110, 1112, 1114, and 1116. The physical regions can be defined as different IC die within the package or finer-grained partitions within a die such as a clock region or clock leaf all sharing the same power rail. The mitigation circuitry 124 is communicatively connected to each physical region 1110, 1112, 1114, and 1116 and enables the different physical regions at different times, reducing the magnitude of the transient load condition, and the corresponding net voltage droop. The mitigation circuitry 124 communicates one or more clock control signals to clock gating circuitry within each of the physical regions 1110, 1112, 1114, and 1116 to control when each of the physical regions is enabled. In one example, the amount of time between enabling each of the physical regions 1110, 1112, 1114, and 1116 is similar. In other examples, the amount of time between enabling a first two of the physical regions 1110, 1112, 1114, and 1116 differs from the amount of time between enabling a second two of the physical regions 1110, 1112, 1114, and 1116. In one example, the amount of time between enabling two of the physical regions 1110, 1112, 1114, and 1116 corresponds to the voltage droop threshold, the current amount of voltage droop, and the additional voltage droop associated with the next physical region to be enabled. Further, while FIG. 11 illustrates four physical regions, in other examples, more than or less than four physical regions may be used.

In one example, a package device (e.g., the package device 1010) includes two or more IC dies (e.g., IC dies 120). Each of the IC dies includes respective mitigation circuitry (e.g., the mitigation circuitry 124). The mitigation circuitry of each IC die controls the voltage droop (e.g., transient load conditions) of the IC die based on the examples illustrated and described with regard to FIGS. 5A, 5B, and 6-11. In one example, at least two mitigation circuitries of at least two IC dies controls the voltage droop (e.g., transient load conditions) of the respective IC dies based on a different combination of the examples illustrated and described with regard to FIGS. 5A, 5B, and 6-11. For example, a first mitigation circuitry of a first IC die uses three different clock signals having three different frequencies driven over three different time periods, and a second mitigation circuitry of a second IC die uses two different clock signals having two different frequencies driven over two different time periods. Further, a first mitigation circuitry of a first IC die may control the timing of the startup of the circuitry blocks of the first IC die to reduce voltage droop associated with the first IC die. A second mitigation circuitry of a second IC die may control the timing of the startup of the clock domains of a second IC die and/or the frequency of the clock signals to control the voltage droop associated with the second IC die.

Figure 12:
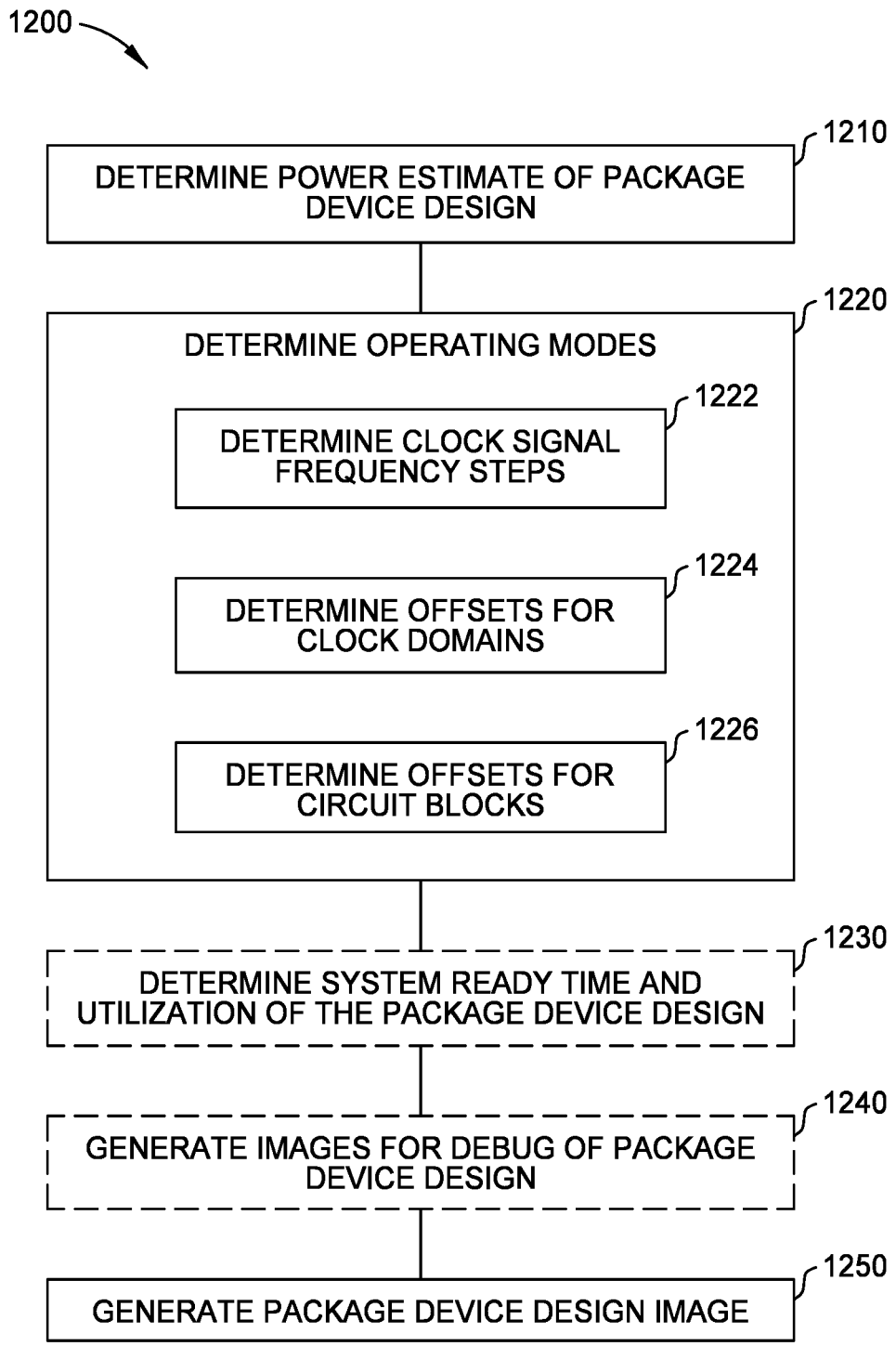
FIG. 12 is a flowchart of a method for generating a package device design image, according to one or more examples.

FIG. 12 illustrates a method 1200 for configuring the operating modes of a package device, according to one or more examples. At block 1210 of the method 1200, a power estimate of a package device design is determined. For example, with reference to FIG. 1, the computer system 150 determines a power estimate of a design associated with the package device 110. The power estimate may be determined by an application executed from instructions stored in the memory 154 and executed by the controller 152. The power estimate corresponds to the amount of the current draw of the package device design. Determining the power estimate includes determining a power estimate for each IC die, each circuit block of each IC and/or each clock domain, among others. Additionally, or alternatively, determining the power estimate includes determining the net voltage droop for the package device design. In one example, the voltage droop associated with each IC die, each circuit block of each IC and/or each clock domain, among others, is determined.

At block 1220 of the method 1200, one or more operating modes for a package device are determined. The one or more operating modes may be determined by comparing the power estimate to a power constraint of the package device design to determine whether or not the voltage droop threshold is exceeded. The voltage droop threshold may be provided as part of the package device design. In one example, the computer system 150 compares the power estimate to the power constraint. The one or more operating modes may alter the net voltage droop of the package device when the magnitude of the net voltage droop of the package device design were determined to exceed the voltage droop threshold.

In one example, the computing system 150 determines the design transient load conditions (e.g., stepload or voltage droop characteristics) in terms of magnitude and time based on the estimated power and the requested and clock frequency to determine if mitigation through one or more operating modes is to be added to the design. In one example, the determination as to whether or not add mitigation is based on the characteristics of the package device design and the possible transient load conditions that the design can accommodate without violating (e.g., exceeding) the voltage parameters (e.g., a net voltage droop threshold), and comparing the transient load conditions to the predicated (or desired) transient load conditions of the package device design. If the predicated transient load conditions (e.g., a voltage droop corresponding to the predicated transient load conditions) exceeds the capabilities of the package device design, one or more operating modes are added to the package design for mitigation and to maintain the final package device within operating specifications. Accordingly, one or more operating modes may be added to the package device design as a mitigation technique or techniques to maintain the package device within the operating specifications. In one example, one or more circuit elements are added to the package device design for mitigation. For example, one or more timed clock gating circuits may be added to the package device design. With reference to FIGS. 5-9, one or more of clock generation circuitry, AND logic, buffers, selection mechanisms, may be added to a package device design for mitigation.

In one example, determining the operating modes comprises block 1222 of the method 1200, determining one or more clock signal frequency steps of the package device. In one example, the clock signal operates at one or more reduced frequencies for one or more periods of time, reducing the net voltage droop of the package device. FIGS. 5A, 6, 7, 8, and 9 describe various ways to control the frequency of a clock signal. In one example, a clock signal has one or more frequency steps, where each frequency step corresponds to a different frequency and a corresponding period. FIG. 5B illustrates an example clock signal having three frequency steps associated with three different periods. In other examples, clock signals having more than or less than three frequency steps may be used. In one example, a clock signal has a desired final operating frequency of 500 kHz. To reduce the net voltage droop, when enabling an IC die, the clock signal frequency is set to be less than 500 kHz. The frequency increases to 500 kHz over a period of time. Accordingly, the net voltage droop is reduced when the IC die is enabled. With reference to FIGS. 5A and 5B, time periods $T_1$ and $T_2$ may correspond to when the IC die 500 is enabled. The frequency of the clock signal 532 during time periods $T_1$ and $T_2$ is less than the frequency of the clock signal 532 during time period $T_3$. Accordingly, during the net voltage droop during time periods $T_1$ and $T_2$ is reduced, and corresponding errors and/or faults within the IC die 500 are mitigated.

In one example, a clock signal includes multiple frequency steps, where each step corresponds to a different frequency. During operation, the clock signal is moved through each of the frequency steps until reaching the final predetermined (e.g., desired) clock signal frequency, reducing the corresponding net voltage droop. The length (e.g., period of time) of the frequency steps may be adjusted to further reduce the net voltage droop. For example, one or more of the frequency steps may be longer than another one or more of the frequency steps. The length of the frequency steps may be adjusted to adjust the net voltage droop during specific time periods and to improve operation of the IC die. In one example, when the transient load conditions of an IC die are the highest, lower clock signal frequencies are used. As the transient load conditions decrease, the clock signal frequencies are increased until the operating frequency is reached while maintaining the magnitude of the net voltage drop to be less than a net voltage droop threshold.

In one example, two or more clock signals are adjusted to each have one or more frequency steps. Each of the clock signals may have the same number of frequency steps or a different number of frequency steps. Further, the length of one or more frequency steps of each clock signal may be the same or different.

Determining the operating modes additionally, or alternatively, includes determining circuit block offsets (block 1224 of the method 1200). In one example, an offset may be added to vary when different clock domains are enabled. FIGS. 9 and 10 illustrate examples of enabling different clock domains within an IC die. By varying when the clock domains are enabled, the net voltage droop of the package device is reduced. The net voltage droop is decreased by varying when the clock domains are enabled, decreasing the amount of circuitry simultaneously enabled. In one example, synchronization signals are added between clock domains. The synchronization signals are utilized to consecutively enable clock domains. In one example, less than all of the clock domains are simultaneously enabled. Further, during different periods, one or more clock domains are simultaneously enabled. In one or more examples, the amount of time between enabling different clock domains is based on the net voltage droop and is determined to maintain the net voltage droop less than the voltage droop threshold.

Additionally, or alternatively, determining the operating modes includes determining ramp up timing for one or more circuit blocks (block 1226 of the method 1200). Ramp up timing is utilized to enable different circuit blocks at different times, reducing the transient load conditions and improving the corresponding net voltage droop. FIG. 9 illustrates an example of using ramp up timing to control when circuit blocks are enabled. In one example, the clock frequency is applied to the associated circuit blocks to determine if mitigation is needed to maintain the net voltage droop below the voltage droop threshold. If the net voltage droop exceeds the threshold, the timing of enabling the circuit blocks is altered to reduce the net voltage droop. For example, instead of enabling all of the circuit blocks simultaneously (e.g., an overlapping period of time), one or more of the circuit blocks is enabled after another one or more of the circuit blocks. The number of circuit blocks that are simultaneously enabled and the timing between enabling circuit blocks may be varied to reduce the transient load condition and maintain the magnitude of the net voltage droop to be less than the voltage droop threshold.

In one example, any combination of blocks 1222, 1224, and 1226 may be utilized to reduce the transient load conditions (e.g., net voltage droop) of a package device design. For example, a package device design may include one or more clock signal frequencies, one or more clock domains that are enabled at different times, and/or one or more circuit blocks that are enabled at different times.

At block 1230 of method 1200, a system ready time and utilization of the package device design is determined. For example, a system ready time corresponds to a time that it takes to reach a full clock frequency. The system ready time is determined based on the amount of time it takes for the clock signals to reach the operational (e.g., desired) clock frequencies. The system ready time may be utilized to determine which clock domains are mitigated and the impacts of the mitigation in terms of startup time (e.g., lag) for an entire clock domain to reach the operational clock frequency. A max utilization of the available transient load conditions of the package device design is also determined. This number may be provided to the computer system 150 such that an end user can determine changes to the package device image to control the customizable power events for the power profile of the package device. For example, in one or more examples, the startup time may exceed operational parameters and package device design is altered to increase the startup time. For example, additional layers may be added to the package design to reduce the stepload, but to decrease the startup time. The additional layers add cost to the package design. Accordingly, there is a tradeoff between adding additional layers and the cost of the design.

Block 1230 is optional, and in one or more examples, block 1230 is omitted from the method 1200.

At block 1240 of the method 1200, one or more images of the package device design are generated for debug. Each of the images may correspond to a different combination of blocks 1222, 1224, and 1226. The image are acquired by the computer system 150 may be provided to a user. The images are used to debug to detect were errors occur in the design according to each different combination of blocks 1222, 1224, and 1226. The images may be used to characterize the applied mitigation techniques used to mitigate voltage droop. During debug, the design associated with the image the produces the most favorable results may be selected and utilized for manufacturing of the package device.

Block 1240 is optional, and in one or more examples, block 1240 is omitted from the method 1200.

At block 1250, a package device design image is generated. The package device design image may be generated based on the changes made to the design in blocks 1222, 1224, and 1226. The package device design image is generated by the computer system 150. Further, the package device design image may be output to a user via a display or printer. Further, the package device design image is utilized to manufacture a corresponding package device. For example, the package device design image may be connected to a computer system configured to manufacture the package device.

Figure 13:
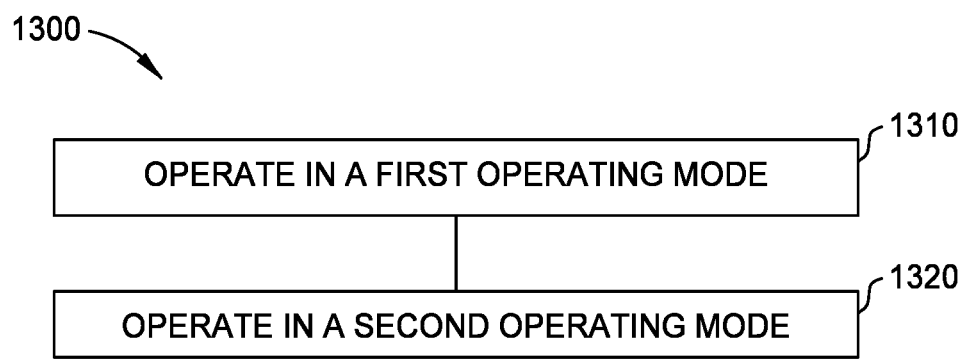
FIG. 13 is a flowchart of a method for operating a package device, according to one or more examples.

FIG. 13 illustrates a flow chart of a method 1300 for operating a semiconductor device, according to one or more examples. At block 1310 of the method 1300, the semiconductor device operates in a first operating mode. For example, the IC die 120 operates in a first operating mode when initially enabled. The first operating mode is associated with a first amount of voltage droop (e.g., first transient load conditions or first stepload). In one example, in the first operating mode, the IC die 120 utilizes a clock signal having a clock signal frequency that is less than the operating frequency of the clock signal. The clock signal may include one or more frequency steps. Each frequency step corresponds to a different frequency. The frequency steps may be the similar in length or one or more of the frequency steps differs in length from another one or more of the frequency steps. In one example, two different clock signals have a respective clock signal frequency that is less the operating frequency of the clock signals are used. The number of frequency steps for each clock signal may be similar or different. Additionally, or alternatively, length of one or more of the frequency steps of a first clock signal differs from the length of one or more of the frequency steps of a second clock signal. Further, the length of each frequency step of a first clock signal is the same as the length of each frequency step of a second clock signal.

Mitigation circuitry is utilized to control the frequency of the clock signal. For example, with reference to FIG. 5A, the mitigation circuitry 124 controls the clock generation circuitry 510 to control the frequency of the clock signal 532. With reference to FIG. 6, the mitigation circuitry 124 controls the AND gate 610 to control the frequency of the clock signal 632. With reference to FIG. 7, the mitigation circuitry 124 controls the buffer 710 to control the frequency of the clock signal 732. With reference to FIG. 8, the mitigation circuitry 124 controls the selection circuitry 810 to control the frequency of the clock signal 832.

Additionally, or alternatively, during the first operating mode an offset is included between the clock domains of one or more circuit blocks of an IC die (e.g., the IC die 120). For example, a first clock domain of an IC die is enabled before a second clock domain of the IC die. An offset may be included between each clock domain of an IC die. In another example, an offset is included between two clock domains and two other clock domains are simultaneously enabled. The offset between clock domains is varied to control the voltage drop of the IC die and/or package device. In one example, including an offset between clock domains reduces the corresponding net voltage droop.

Mitigation circuitry is utilized to control the enablement of clock domains. For example, with reference to FIG. 10, the mitigation circuitry 124 controls the timing of enabling the clock signals 1032. Further, with reference to FIG. 11, the mitigation circuitry 124 controls the timing of enabling the physical regions 1110-1116.

In one example, the amount of time between enabling clock domains or physical regions is determined to maintain the net voltage droop to not exceed the voltage droop threshold. For example, after enabling a first clock domain or physical region, a second clock domain or physical region is enabled once sufficient headroom with reference to the voltage droop threshold is available. In one example, a first clock domain or physical region is enabled before a second clock domain or physical region and the second clock domain or physical region is enabled before a third clock domain or physical region is enabled. The amount of time between enabling the first clock domain or physical region and enabling the second clock domain or physical region is equal to, less than, or greater than the amount time between enabling the second clock domain or physical region and the third clock domain or physical region. In one example, two or more clock domain or physical region are enabled during a first period and, and during a second period, a different number of clock domains or physical regions are enabled.

Additionally, or alternatively, the ramp up timing between one or more circuit blocks of an IC die is varied when operating in the first operating mode. For example, a first circuit block of an IC die is enabled before a second circuit block of an IC die. The delay between enabling the circuit blocks reduces the net voltage droop of the IC die.

In one example, the amount of time between enabling circuit blocks is determined to maintain the net voltage droop to not exceed the voltage droop threshold. After enabling a first circuit block, a second circuit block may be enabled once sufficient headroom with reference to the voltage droop threshold is available. In one example, a first circuit block is enabled before a second circuit block and the second circuit block is enabled before a third circuit block is enabled. The amount of time between enabling the first circuit block and enabling the second circuit block is equal to, less than, or greater than the amount time between enabling the second circuit block and the third circuit block. In one example, two or more circuit blocks are enabled simultaneously during a first period and, during a second period, a different number of circuit blocks are enabled.

Mitigation circuitry is utilized to control the enablement of the circuit blocks. For example, with reference to FIG. 12, the mitigation circuitry 124 controls the timing of the enablement of the circuit blocks 1212 of an IC die (e.g., an IC die 120).

In one example, mitigation circuitry (e.g., the mitigation circuitry 124) controls two or more of the frequency of a clock signal, the offset between enabling clock domains, and the timing between enabling circuit blocks.

At 1320 of the method 1300, the IC die operates in a second mode. In the second mode, the net voltage droop associated with the IC die is greater than the net voltage droop of the IC die during the first operating mode. The second operating mode occurs after a period of time associated with operating in the first operating mode. Further, in the second operating mode, the clock signal frequencies are at the corresponding operating frequencies.

The method 1300 may transition from the second operating mode to the first operating mode based on a power on and/or reset of the corresponding IC die and/or package device.

Figure 14:
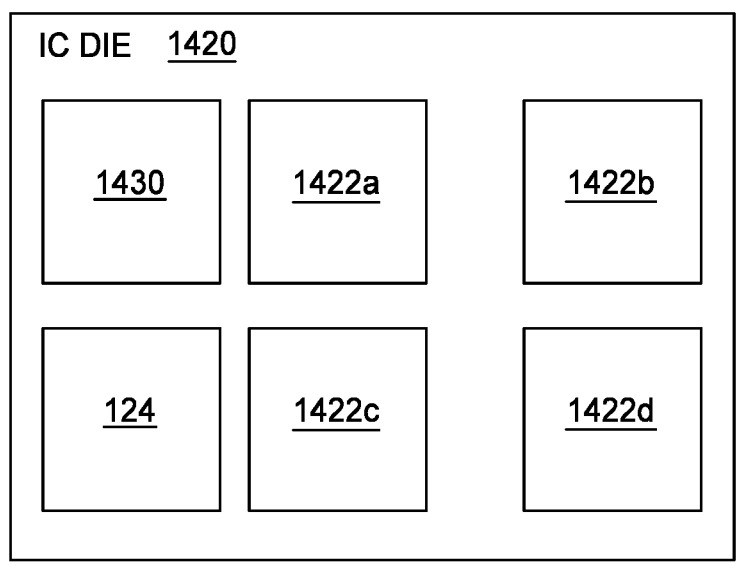
FIG. 14 is a block diagram of an IC die, according to one or more examples.

FIG. 14 illustrates the IC die 1420, according to one or more embodiments. The IC die 1420 may be one of the IC dies 120 of the package device 110 of FIG. 1. The IC die 1420 includes circuit blocks 1422, sensing circuitry 1430, and mitigation circuitry 124. The circuit blocks 1422 are configured similar to the circuit blocks 122 of FIG. 1.

The sensing circuitry 1430 is configured to sense noise within a power network (e.g., a PDN) of the IC die 1420. The sensing circuitry 1430 is high frequency sensing circuitry. The sensing circuitry 1430 determines the amount of voltage droop corresponding to the IC die 1420. Based on a determination that the voltage droop exceeds a voltage droop threshold, the sensing circuitry 1430 communicates a trigger signal to the mitigation circuitry 1440 to employ one or more of the mitigation techniques as described above with regard to FIGS. 5-10 to maintain the net voltage droop to be less than a voltage droop threshold. The voltage droop threshold may correspond to a voltage droop where errors may occur within the IC die or a percentage of the voltage droop where errors may occur within the IC die.

Figure 15:
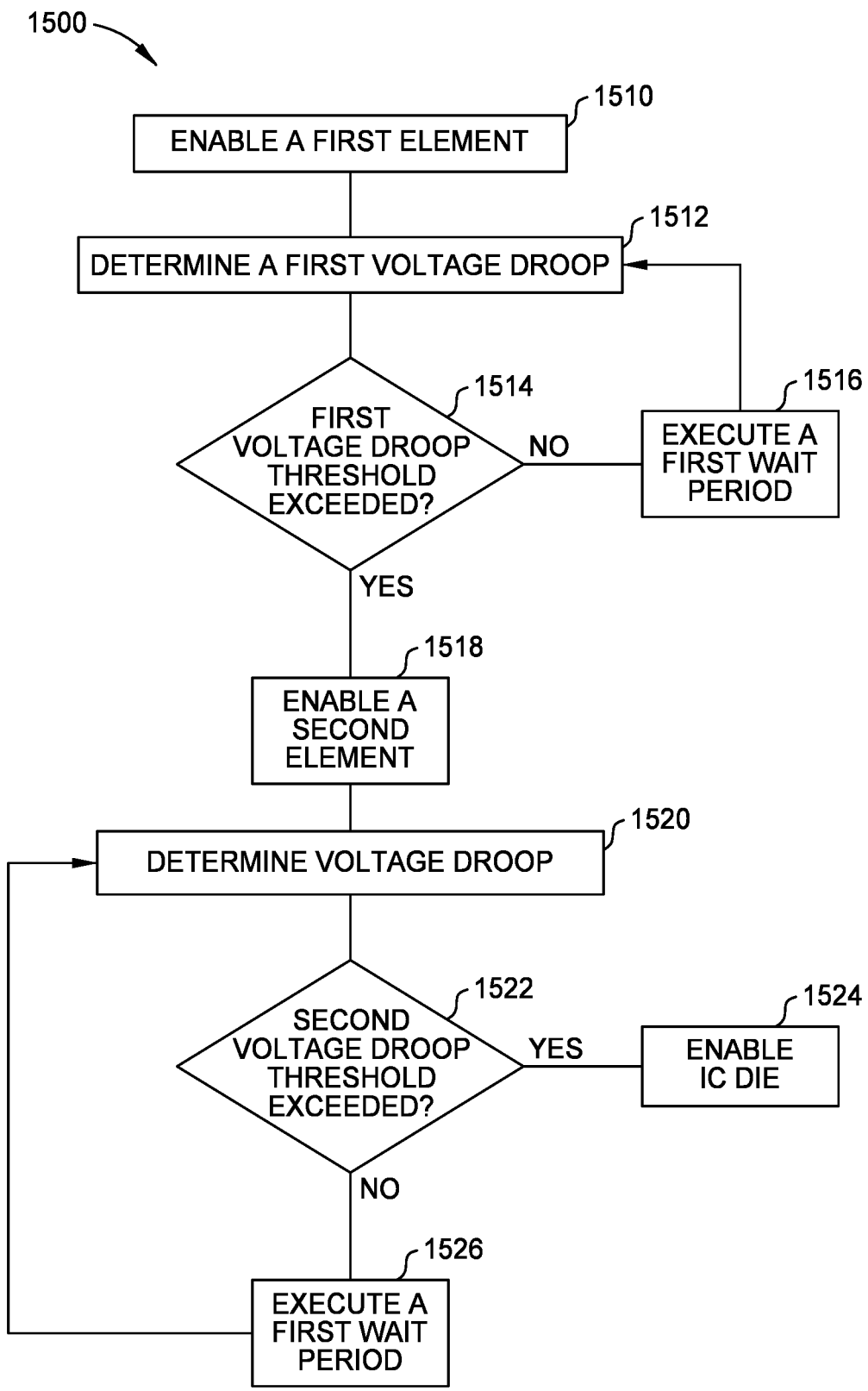
FIG. 15 is a flowchart of a method for operating a package device, according to one or more examples.

FIG. 15 illustrates flow chart of a method 1500 for enabling an IC die, according to one or more examples. At block 1510 of the method 1500, a first element of an IC die is enabled. For example, with reference to FIG. 14, the circuit block 1422*a* is enabled. At block 1512 of the method 1500, a first voltage droop is determined. For example, with reference to FIG. 14, the sensing circuitry 1430 determines a voltage droop associated with enabling the circuit block 1422*a*. At 1514 of the method 1500, a determination as to whether or not the first voltage droop exceeds a first voltage droop threshold is made. For example, with reference to FIG. 14, the sensing circuitry 1430 compares the first voltage droop (e.g., the voltage droop associated with enabling the circuit block 1422*b*) to a first voltage droop threshold. The first voltage droop threshold is Y mV, where Y is one or greater. In other examples, Y is greater than 0.

At block 1516 of the method 1500, if the first voltage droop exceeds the first voltage droop threshold, a first wait period is executed. For example, with reference to FIG. 14, the sensing circuitry 1430 waits for a first period. The first period is one or more clock cycles of a clock signal or milliseconds. At the completion of the wait period, the method 1500 returns to the block 1512, followed by the block 1514.

If, at block 1514, the first voltage droop is determined to not exceed the first voltage threshold, a second element is enabled at block 1516 of the method 1500. For example, with reference to FIG. 14, the circuit block 1422*b* is enabled. At block 1520 of the method 1500, a second voltage droop is determined. For example, with reference to FIG. 14, the sensing circuitry 1430 determines a voltage droop associated with enabling the circuit block 1422*b*. At 1522 of the method 1500, a determination as to whether or not the second voltage droop exceeds a second voltage droop threshold is exceeded is made. For example, with reference to FIG. 14, the sensing circuitry 1430 compares the second voltage droop (e.g., the voltage droop associated with enabling the circuit block 1422*b*) to a second voltage droop threshold. The second voltage droop threshold is X mV, where X is one or greater. In other examples, X is greater than 0. The second voltage droop threshold is greater than, less than, or equal to the first voltage droop threshold.

At block 1526 of the method 1500, if the second voltage droop exceeds the second voltage droop threshold, a second wait period is executed. For example, with reference to FIG. 14, the sensing circuitry 1430 waits for a second period. The second period is one or more clock cycles of a clock signal or milliseconds. The second wait period is longer, shorter, or the same as the first wait period. At the completion of the wait period, the method 1500 returns to the block 1520, followed by the block 1522.

Block 1524 is executed based on a determination that the second voltage droop does not exceed the second voltage droop threshold when the IC die is enabled. For example, with reference to FIG. 14, the IC die 1420 is enabled based on the second voltage droop does not exceeding the second voltage droop threshold.

While the method 1500 is described with regard to enabling different circuit blocks, in another example, the method 1500 may be utilized to control when an IC die (e.g., the IC die 120 or 1420) operates in different operating modes. For example, instead of determining to enable different elements of an IC die at blocks 1510, 1520, and 1524, different clock signal frequencies may be used, different clock domains may be enabled, and/or different IC dies may be enabled.

In one or more examples, transient load conditions of an IC die may result in a voltage droop that exceeds a voltage droop threshold. Accordingly, errors or faults may occur within the operation of the IC die. The transient load conditions of an IC die and a corresponding voltage droop may be reduced by configuring the IC die with one or more operational modes. An IC die may be configured with an operational mode in which a clock signal of the IC die has one or more frequency steps. The frequency of the clock signal is reduced as compared to an operating frequency in at least one of the frequency steps. Reducing the frequency of the clock signal reduces the transient load conditions and the associated voltage droop. Further, the IC die may be configured with an operational mode in which one or more offsets are added between clock domains. For example, one or more clock domains may be enabled before a second one or more clock domains. Adding an offset between enabling clock domains reduces the transient load conditions and the associated voltage droop. The IC die may be further configured with an operational mode in which one or more offsets are added between circuit blocks. For example, one or more circuit blocks may be enabled before another one or more circuit blocks. Accordingly, enabling different circuit blocks at different times, reduces the transient load conditions and the associate voltage droop. Further, the voltage droop associated with a package device may be observed as the package device is enabled. For example, different IC dies within the package device are enabled at different times to reduce transient load conditions and a corresponding voltage droop. Employing the above methods for reducing transient load conditions, reduces the associated voltage droop for an IC die and/or package device. Accordingly, the above methods reduce errors and faults within an IC die and/or package device.

While the foregoing is directed to specific examples, other and further examples may be devised without departing from the basic scope thereof, and the scope thereof is determined by the claims that follow.

What is claimed is:

1. A semiconductor device system comprising:
 a first integrated circuit (IC) die configured to:

operate in a first operating mode during a first period, the first period associated with enabling a first element of the first IC die and a first amount of voltage droop, wherein, in the first operational mode, the first element is enabled before a second element of the first IC die; and operate in a second operating mode during a second period, the second period occurs after the first period and is associated with a second amount of voltage droop, wherein the second amount of voltage droop is less than the first amount of voltage droop.

2. The semiconductor device system of claim 1, wherein the first IC die comprises mitigation circuitry configured to control the first IC die to operate in the first operating mode and the second operating mode.

3. The semiconductor device system of claim 2, wherein the IC die further comprises programmable circuitry, and wherein the programmable circuitry comprises the mitigation circuitry.

4. The semiconductor device system of claim 2, wherein the mitigation circuitry is configured to control the first IC die to operate in the first operating mode and the second operating mode to maintain the first amount of voltage droop and the second amount of voltage droop below a threshold voltage droop amount.

5. The semiconductor device system of claim 1, wherein the first element is a first frequency of a first clock signal, and the second element is a second frequency of the first clock signal, the second frequency is greater than the first frequency, and, in the second operating mode, the first clock signal has a third frequency higher than the second frequency.

6. The semiconductor device system of claim 5, wherein, in the first operating mode, the first clock signal has the first frequency for a first time period and the second frequency for a second time period.

7. The semiconductor device system of claim 6, wherein a length of the first period differs from a length of the second time period.

8. The semiconductor device system of claim 1, wherein the first element is a first circuit block of the first IC die, and the second element is a second circuit block.

9. The semiconductor device system of claim 1, wherein the first element is a first clock domain of the first IC die, and the second element a second clock domain.

10. The semiconductor device system of claim 1 further comprising:

a second IC die communicatively connected to the first IC die, the second IC die is enabled during a third period, wherein the third period occurs after the first period.

11. The semiconductor device system of claim 1, a second IC die communicatively connected to the first IC die, the second IC die is configured to operate in a third operating mode, wherein the third operating mode differs from at least one of the first operating mode and the second operating mode.

12. The semiconductor device system of claim 1, wherein the first amount of voltage droop is compared to a threshold, and wherein the first IC die operates in the second operating mode based on the first amount of voltage droop being less than the threshold.

13. An integrated circuit (IC) die comprising:

a first circuit block configured to:

operate in a first operating mode during a first period during, the first period associated with enabling the first circuit block and a first amount of voltage droop, wherein in the first operating mode a first element is enabled before a second element; and operate in a second operating mode during a second period, the second period occurs after the first period and is associated with a second amount of voltage droop, wherein the second amount of voltage droop is less than the first amount of voltage droop; and mitigation circuitry connected to the first circuit block, and configured to control the first operating mode and the second operating mode.

14. The IC die of claim 13, wherein, in the first operating mode, the first element is a first frequency of a first clock signal, and the second element is a second frequency of the first clock signal, the second frequency higher than the first frequency, and, in the second operating mode, the first clock signal has a third frequency higher than the second frequency.

15. The IC die of claim 13, wherein the first element is the first circuit block and the second element is a second circuit block.

16. The IC die of claim 13, wherein the first element is a first clock domain of the first circuit block, and the second element is a second clock domain.

17. A method for operating an integrated circuit (IC) die, the method comprising:

operating in a first operating mode during a first period, the first period associated with enabling a first element of the IC die and a first amount of voltage droop, wherein, in the first operational mode, the first element is enabled before a second element of the first IC die; and operating in a second operating mode during a second period, the second period occurs after the first period and is associated with a second amount of voltage droop, wherein the second amount of voltage droop is less than the first amount of voltage droop.

18. The method of claim 17, wherein, in the first operating mode, the first element is a first frequency of a first clock signal and the second element is a second frequency of the first clock signal, the second frequency is higher than the first frequency, and, in the second operating mode, the first clock signal has a third frequency higher than the second frequency.

19. The method of claim 17, wherein the first element is a first circuit block, and the second element is a second circuit block is enabled.

20. The method of claim 17, wherein the first element is a first clock domain, and the second element is a second clock domain is enabled.

* * * * *